(12) United States Patent
Katsap

(10) Patent No.: US 10,593,505 B1
(45) Date of Patent: Mar. 17, 2020

(54) LOW TEMPERATURE, HIGH-BRIGHTNESS, CATHODE

(71) Applicants: NuFlare Technology, Inc., Kanagawa (JP); NuFlare Technology America, Inc., Sunnyvale, CA (US)

(72) Inventor: Victor Katsap, Cornwall, NY (US)

(73) Assignees: NuFlare Technology, Inc., Kanagawa (JP); NuFlare Technology America, Inc., Sunnyvale, CA (US)

(*) Notice: Subject to any disclaimer, the term of this patent is extended or adjusted under 35 U.S.C. 154(b) by 0 days.

(21) Appl. No.: 16/203,524

(22) Filed: Nov. 28, 2018

(51) Int. Cl.
*H01J 9/04* (2006.01)
*H01J 1/14* (2006.01)
*H01J 37/065* (2006.01)
*H01J 1/15* (2006.01)

(52) U.S. Cl.
CPC ............. *H01J 9/04* (2013.01); *H01J 1/14* (2013.01); *H01J 1/15* (2013.01); *H01J 37/065* (2013.01); *H01J 2201/19* (2013.01); *H01J 2237/06308* (2013.01)

(58) Field of Classification Search
CPC ........ H01J 9/04; H01J 1/15; H01J 1/14; H01J 37/065; H01J 2237/06308; H01J 2201/19
See application file for complete search history.

(56) References Cited

U.S. PATENT DOCUMENTS

| | | | |
|---|---|---|---|
| 6,432,325 B1* | 8/2002 | Hamada | H01J 1/142 252/518.1 |
| 7,176,610 B2 | 2/2007 | Katsap | |
| 9,165,737 B2 | 10/2015 | Katsap | |
| 2014/0097736 A1* | 4/2014 | Katsap | H01J 1/14 313/37 |
| 2017/0207055 A1* | 7/2017 | Jacobs | H01J 19/062 |

* cited by examiner

*Primary Examiner* — Donald L Raleigh
(74) *Attorney, Agent, or Firm* — Oblon, McClelland, Maier & Neustadt, L.L.P.

(57) ABSTRACT

Thermionic cathodes and an electron emission apparatus are provided. The thermionic cathodes comprise perovskite material in crystal or sintered form. The thermionic cathodes provide strong electron emission at low operating temperatures.

18 Claims, 4 Drawing Sheets

LOW TEMPERATURE, HIGH-BRIGHTNESS, CATHODE

BACKGROUND

1. Field

This invention generally relates to a thermionic cathode. In particular, the invention provides a cathode in which a perovskite is used operating at a low temperature, thereby prolonging the useful life of the thermionic cathode and producing electrons with low thermal energy spread.

2. Background

An electron-beam (e-beam) lithography cathode must provide high brightness along with high emittance and a uniform beam profile. The emission uniformity requirement leads to the use of a single crystalline surface.

In shaped beam lithography tools, a 50 keV (kilo electronvolt) electron beam irradiates a thin layer of resist on the top of a quartz substrate. Resist exposure is achieved by the electrons colliding with resist molecules. After exposure, developing, and etching steps, a photomask is made.

Existing e-beam lithography tools (e.g., lithographic tools, probes, free electron lasers, and electron and ion guns) and characterization tools (e.g., scanning electron microscopes (SEMs) and transmission electron microscopes (TEMs)) use cathodes primarily made of lanthanum hexaboride ($LaB_6$) or cerium hexaboride ($CeB_6$), in sintered or crystalline form. These cathodes, however, have disadvantages. Emitter material evaporates with a rate that depends on temperature and vacuum pressure. Brightness is inversely proportional to the operating temperature and proportional to the applied current density. At typical operating temperatures (1650K to 1900K (Kelvin)), $LaB_6$ crystalline material evaporates at the rate of several microns per 100 hours, which limits the cathode's useful life. Generally, the higher the operating temperature, the faster the evaporation rate. The effect of this evaporation is the eventual loss of tip structure and the end of the cathode's useful lifetime. Thus, increasing the operating temperature to increase brightness leads to a decrease in the cathode's lifetime due to the faster evaporation rate. Further, brightness is inversely proportional to a work function of a material. In other words, a material having a lower work function has a higher brightness at an operating temperature compared to a material having a higher work function.

Existing cathodes have a short lifetime due to the high operating temperature. Accordingly, what is needed, as recognized by the present inventor, is a cathode that can operate at a lower temperature and therefore having an extended lifetime while maintaining a high source brightness.

The foregoing "Background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention.

SUMMARY

The present disclosure relates to a thermionic cathode including an emitter. The emitter is made of perovskite oxide in crystal or sintered form.

The present disclosure also relates to an electron emission apparatus. The electron emission apparatus includes a thermionic cathode, a heat source, and a support. The emitter is made of perovskite material in crystal or sintered form. The heat source is operably connected to the thermionic cathode to provide heat to the cathode. The support holds the emitter and the heat source.

The present disclosure also relates to a thermionic cathode. The thermionic cathode includes an emitter. The emitter includes a coating of a perovskite material, wherein an operating temperature of the thermionic cathode is in a range from 900° C. to 1500° C.

In one aspect, the perovskite material is strontium vanadate ($SrVO_3$).

In one aspect, the perovskite material is strontium niobate ($SrNbO_3$).

In one aspect, an operating temperature of the thermionic cathode is from 1000° C. to 1400° C.

In one aspect, the emitter is made of a perovskite material crystal and the crystal has a (100) orientation.

In one aspect, the thermionic cathode includes a non-emissive coating applied to an outer surface of sides of the emitter.

The foregoing paragraphs have been provided by way of general introduction, and are not intended to limit the scope of the claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1A:
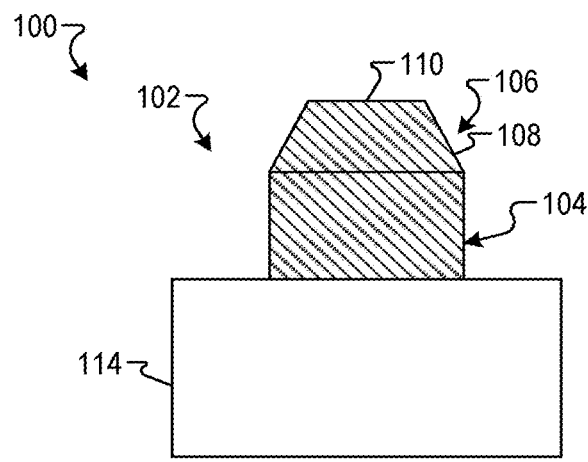
FIG. 1A is a schematic that shows a cross-sectional side view of a cathode according to one example.

Referring now to the drawings, wherein like reference numerals designate identical or corresponding parts throughout several views, the following description relates to an emitter, an apparatus, and associated methodology for electron beam (e-beam) lithography.

The e-beam lithography cathode described herein provides high brightness along with high emittance and a uniform beam profile. Brightness is inversely proportional to the operating temperature, but emission current density is exponentially proportional to operating temperature. Overall, an increase in an operating temperature provides an increase in brightness. However, the increase in the operating temperature results in an increase in the evaporation rate of the material and therefore decreases the lifetime of the emitter. Brightness is inversely proportional to a work function of a material. In other words, a material having a lower work function has a higher brightness at an operating temperature compared to a material having a higher work function. The emitter described herein has a low work function compared to conventional emitters. The emitter described herein (i.e., thermionic emitter) provides high brightness at low operating temperatures (compared to a $LaB_6$ emitter). Lower operating temperatures extend the cathode lifetime due to a lower evaporation rate. In one embodiment, the emitter may be made of sintered strontium vanadate ($SrVO_3$) or strontium niobate ($SrNbO_3$), and of a single crystal of aforementioned materials having a crystallographic orientation of (100).

FIG. 1A is a schematic that shows a cross-sectional side view of a cathode 100 according to one example. The cathode 100 includes an emitter 102. The emitter 102 is held in a holder 114 (i.e., support, base). The holder 114 holds the emitter 102 steady in space.

The emitter 102 may be formed using a single crystal, which may or may not be sintered. Sintered materials are those formed from particles that are bonded due to exposure to heat and/or pressure, as recognized by one of ordinary skill in the art. The emitter 102 may be formed using a perovskite material. The perovskite material used herein has a chemical formula of "$ABO_3$", in which A and B are cations. For example, strontium vanadate ($SrVO_3$) or strontium niobate ($SrNbO_3$) may be used as emitter 102. The perovskite material may be characterized by its work function. In one example, the perovskite oxide exhibits a work function of less than 2.50 eV (electronvolt). This includes embodiments in which the work function is less than about 2.30 eV, less than about 2.10 eV, and less than about 1.90 eV.

$SrVO_3$ and $SrNbO_3$ have low work functions, specifically between 1.80 eV and 1.90 eV. The low work function of the emitters described herein facilitates high-current density, high brightness, thermionic emission at relatively low temperatures. The emitter 102 may operate in the range of from about 900° C. to about 1500° C., or in the range of from about 1000° C. to about 1400° C., e.g., about 1000° C., 1050° C., 1100° C., 1150° C., 1200° C., 1250° C., 1300° C., 1350° C., or 1400° C. In contrast, the widely used $LaB_6$ emitter work function is much higher, specifically between 2.50 eV and 2.70 eV, and it typically operates at a temperature in a range between 1500° C. and 1600° C.

In one example, the perovskite crystal may have a crystallographic orientation of (100). Other crystallographic orientations may be used based on the work function of the perovskite crystal.

In one embodiment, the emitter 102 has a main body having a lower part 104 and an upper part 106 (e.g., about the upper 10 µm-200 µm of the emitter crystal). The length of the emitter 102 generally ranges from about 0.50 mm to about 3 mm. The lower part 104 and the upper part 106 are formed integrally. The main body may be of any suitable shape. The main body size and shape may be based on the cathode application (e.g., scanning electron microscopes (SEMs), transmission electron microscopes (TEMs), probes, free electron lasers, electron and ion guns) and the type of heat source employed. For example, a Vogel-type mount requires a rectangular main body. A coaxial heater requires a cylindrical main body shape. The upper part 106 may be conical, cylindrical, square, rectangular, pyramidal, or the like.

A cross section of the lower part 104 is generally round or rectangular with a diameter (or width if rectangular) in the range of from about 20 µm to about 800 µm, or in the range of from about 30 µm to about 250 µm, e.g., about 30, 50, 70, 90, 110, 130, 150, 170, 180, 200, 220, or 250 µm.

In one embodiment, the lower part 104 has a cylindrical shape and has straight sides. The upper part 106 has a conical surface 108 and an electron emitting surface 110 provided at an upper end of the upper part 106. The cathode emitter cone angle may be in the range from about 20 degrees to about 90 degrees, e.g., about 20, 25, 30, 35, 40, 45, 50, 55, 60, 65, 70, 75, 80, 85, or 90 degrees.

The electron emitting surface 110 has an emitting area size of 30 µm to 250 µm in diameter if round depending on the desired degree of truncation and the desired cone angle (or 30 µm to 250 µm in diagonal if square-shaped). In one example, the electron emitting surface 110 has an emitting area size in the range of about 50 µm to about 200 µm, e.g., about 50, 70, 90, 110, 130, 150, 170, 180, or 200 µm. In the cathode 100 in FIG. 1A, the shape of the electron emitting surface 110 is flat, but it may be curved (e.g., spherical or dome-shaped). The shape of the electron emitting surface 110 may be based on the application. In one implementation, sidewalls of the emitter 102 may be coated with a non-emissive material for higher practical brightness. For example, a coating is applied to at least an outer surface of the upper part 106 and may encase part or all of the lower part 104. The coating may be formed from any suitable material, examples of which include but are not limited to graphite, colloidal graphite (e.g., aquadag), DLC (diamond-like carbon), pyrolytic carbon, and the like. The choice of carbon coating may depend upon several factors, including but not limited to cost of cathode production, facilities available for carrying out the deposition, and the like. The carbon may be deposited using chemical vapor deposition (CVD), pyrolytic carbon deposition, or the like. A thickness of the carbon coating may be up to 100 µm. In one example, the thickness is in the range from about 8 µm to 10 µm.

Figure 1B:
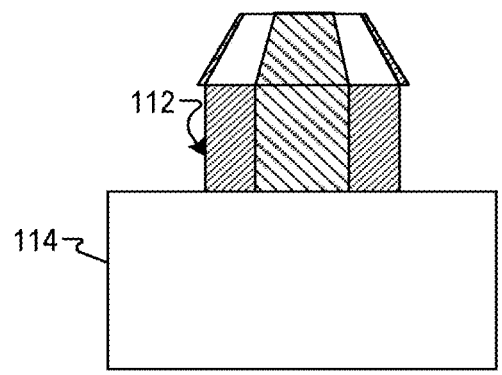
FIG. 1B is a schematic that shows a cross-sectional side view of a cathode including a non-emissive coating according to one example.

FIG. 1B is a schematic that shows a cross-sectional side view of the cathode 100 having a coated emitter according to one example. The coating 112 covers an outer surface of the sides of the lower part 104 and the upper part 106 for the purpose of suppressing evaporation of the emitter 102 to extend the usable time (lifetime) of the cathode 100. The coating 112 may be directly in contact with the perovskite oxide surface or separated by a gap as disclosed, for example, in U.S. Pat. No. 9,165,737, entitled "HIGH BRIGHTNESS, LONG LIFE THERMIONIC CATHODE AND METHOD OF ITS FABRICATION", the entire disclosure of which is incorporated herein by reference. The coating 112 may contain inevitable impurities.

Figure 2:
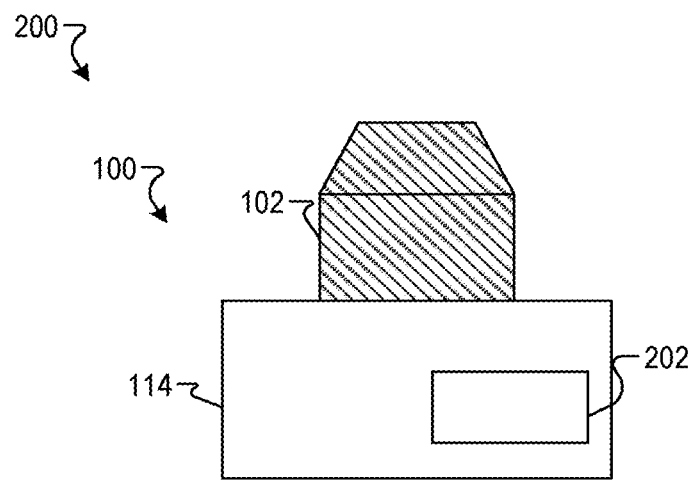
FIG. 2 is a schematic that shows the cross-sectional side view of an electron emission apparatus according to one example.

FIG. 2 is a schematic that shows a cross-sectional side view of an electron emission apparatus 200 according to one example. The electron emission apparatus 200 includes a cathode 100, an emitter heater 202 (heat source), and a holder or support 114. The holder 114 functions to hold the components of the apparatus in positions suitable for operation of the apparatus 200. The holder 114 may include elements such as a ferrule directly connected to the emitter 102, a base and/or sub-base (e.g., of ceramic) to which the various elements are connected, various mounting strips, clips, and the like for holding the support element together, as would be understood by one of ordinary skill in the art. The emitter heater 202 may be a carbon heater rod, a resistive spiral, or the like, as would be understood by one of ordinary skill in the art. The emitter heater 202 is operably connected to the cathode 100 in a manner such that sufficient heat can be provided to the cathode 100 to cause electron emission from the emitter 102. The specific design and combination of elements of the apparatus 200 may vary from application to application.

The apparatus 200 may also include a positive electrode (anode) (not shown) located above the emitter 102 to facilitate electric field formation to pull emitted electrons away from the emitter and into electron beam. Then, the emitted electron beam is shaped, modulated, focused, and corrected in order to strike electron-sensitive resist in certain pattern and expose it, thus completing the e-beam lithography process.

Lower operating temperatures of the emitter described herein allow for sharper focusing of the electron beam, thus improving e-beam lithography quality and imaging quality. In addition, lower operating temperatures also facilitate longer life of electron guns and the high voltage insulation components associated with the electron guns.

Figure 6:
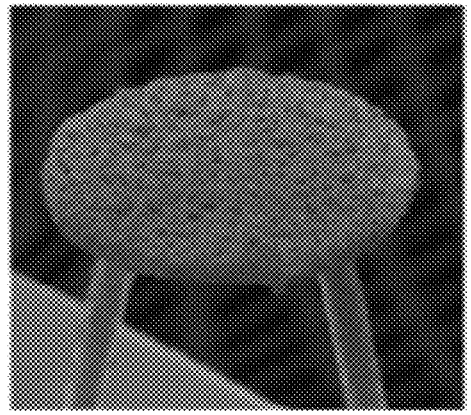
FIG. 6 is a schematic that shows images of the cathode with a $SrVO_3$ coating according to one example.

In one implementation, the emitter 102 is coated with $SrVO_3$. Exemplary images of the emitter coated with $SrVO_3$ are shown in FIG. 6.

Figure 7:
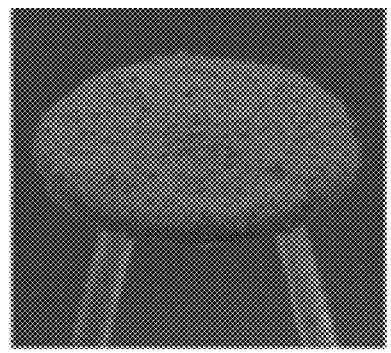
FIG. 7 is a schematic that shows images of the cathode with a $SrNbO_3$ coating according to one example.

In one implementation, the emitter 102 is coated with $SrNbO_3$. Exemplary images of the emitter coated with $SrNbO_3$ are shown in FIG. 7.

This disclosure also provides methods for making the cathodes described herein. In general, the manufacture of the cathodes described herein is carried out according to methods and steps known in the art. In one embodiment, the methods of fabricating the cathode described herein include, but are not limited to, the following step: providing an emitter made of a perovskite oxide crystal properly grown and shaped having an emitter body, a conical portion or section, and a tip.

In one embodiment, a carbon coating is applied on the upper and/or lower part of the emitter.

The thermionic cathode 100 described herein may be used in electron beam lithography tools, scanning electron microscopes or in any other application where a thermionic cathode might be utilized.

In one embodiment, a method of using the electron emission apparatus 200 includes applying energy to the cathode 100 of the electron emission apparatus 200 suitable to induce the emission of electrons from the perovskite oxide crystal of the emitter 102.

EXAMPLES

Figure 3:
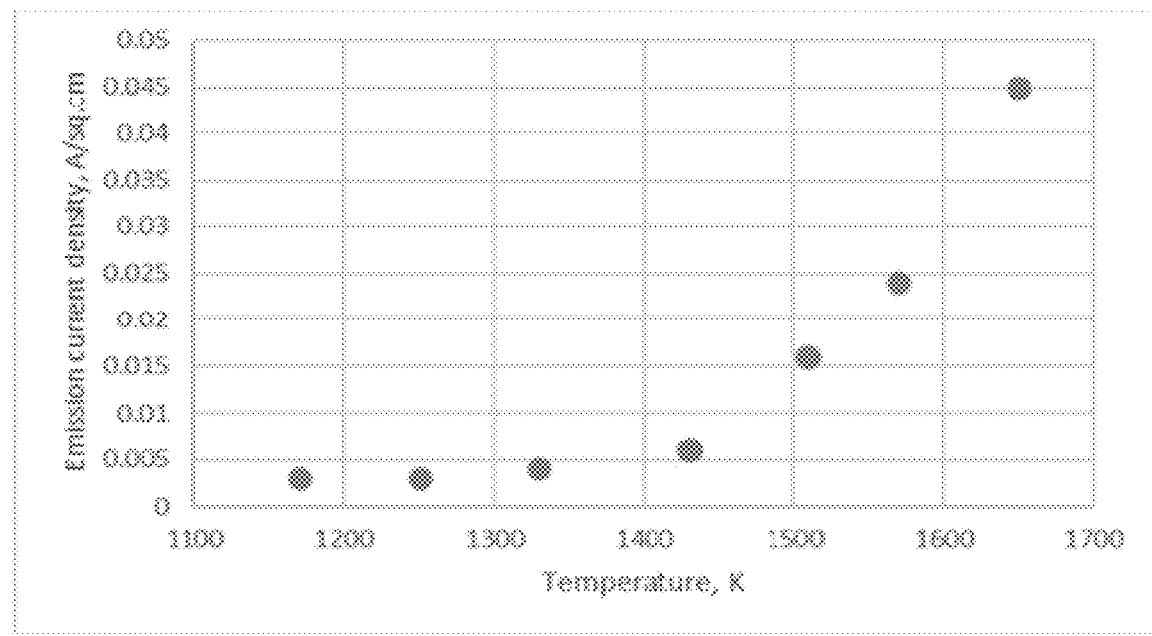
FIG. 3 is a schematic that illustrates emission current density as a function of temperature according to one example.

Further studies were undertaken in order to investigate the emitter 102. In this example, the emitter was heated up to 1650 K and the emission current density was measured. FIG. 3 shows the emission current density as a function of the temperature of a $SrVO_3$ coated cathode (e.g., the cathode shown in FIG. 6). The emitter 102 had an emission current density of 0.045 A/cm$^2$ at 1650 K. A $SrNbO_3$ coated cathode has a similar current density as shown in FIG. 5.

Figure 4:
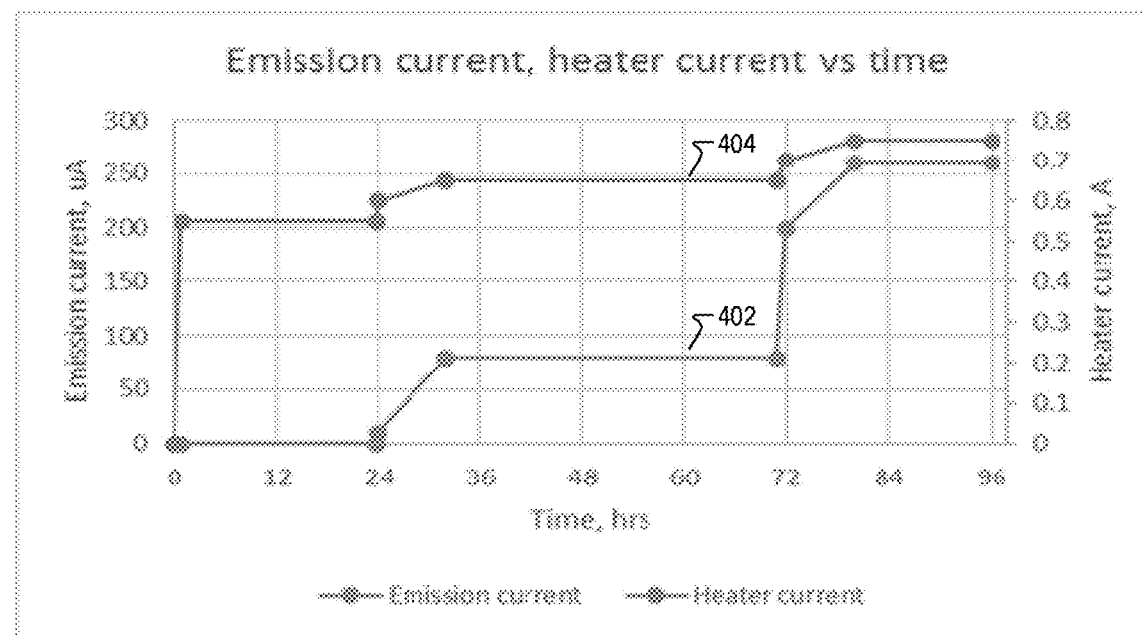
FIG. 4 is a schematic that illustrates emission current and heater voltage of the cathode as a function of time according to one example.

FIG. 4 illustrates the emission current (trace 402) and the heater voltage (trace 404) as a function of the time elapsed of the $SrVO_3$ coated cathode. The emission was observed to be stable over a period of 60 hours.

Emission current from a first cathode made from $SrNbO_3$ was compared with a second cathode made from $SrVO_3$.

Figure 5:
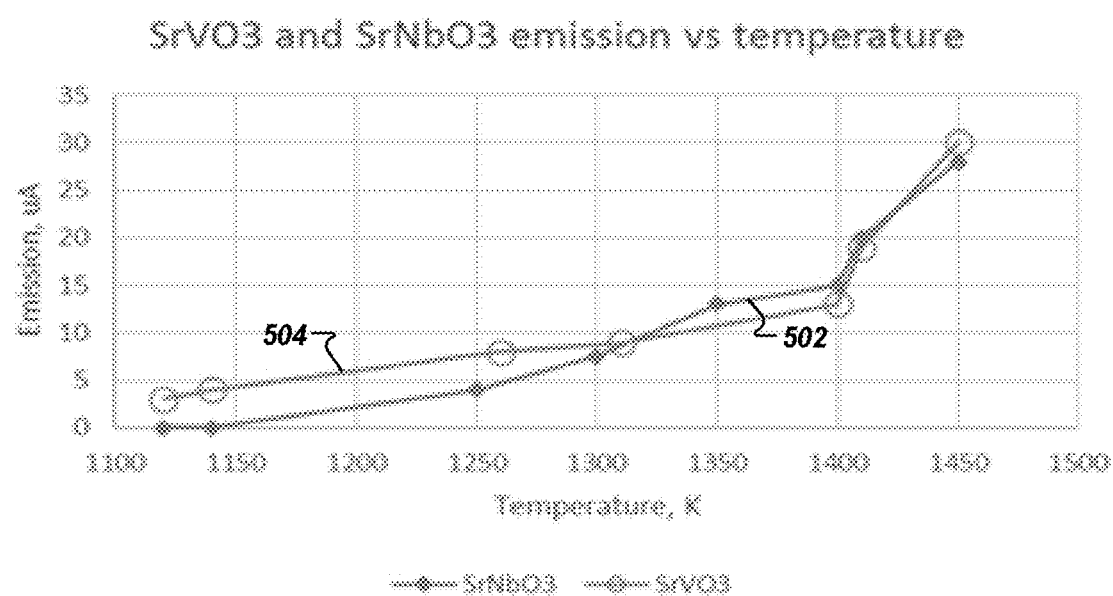
FIG. 5 is a schematic that illustrates the emission current of a strontium vanadate ($SrVO_3$) emitter and of a strontium niobate ($SrNbO_3$) emitter as a function of temperature according to one example.

FIG. 5 illustrates the emission current of the first cathode (trace 502) and the second cathode (trace 504) as a function of temperature. The emission current from the second cathode was observed to be higher, i.e., in a range from about 1150 K to about 1310 K.

The features of the present disclosure provide a multitude of improvements in the field of e-beam lithography. In particular, the cathode can operate in a temperature range of 1000° C. to 1400° C. with good stability for extended periods of time.

Obviously, numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A thermionic cathode, comprising:
   an emitter consisting of a perovskite material in crystal or sintered form, wherein an operating temperature of the thermionic cathode is in a range from 900° C. to 1500° C.,
   wherein the perovskite material has a formula ABO3, where A is strontium and B is selected from vanadium (V), Niobium (Nb), and combinations thereof.

2. The thermionic cathode of claim 1, wherein an emission current density of the emitter is 0.045 A/cm2 and the operating temperature is 1650 K.

3. The thermionic cathode of claim 1, wherein the perovskite material exhibits a work function of less than 1.90 eV.

4. The thermionic cathode of claim 3, wherein the perovskite material exhibits a work function in the range of 1.80 eV to 1.90 eV.

5. The thermionic cathode of claim 1, wherein the perovskite material is strontium vanadate (SrVO3).

6. The thermionic cathode of claim 1, wherein the perovskite material is strontium niobate (SrNbO3).

7. The thermionic cathode of claim 1, wherein the emitter consists of a perovskite crystal and the crystal has a crystallographic orientation of (100).

8. The thermionic cathode of claim 1, further comprising a non-emissive coating on an outer surface of sides of the emitter.

9. The thermionic cathode of claim 8, wherein the non-emissive coating is a carbon coating.

10. The thermionic cathode of claim 1, wherein the operating temperature of the thermionic cathode is in a range from 1000° C. to 1400° C.

11. The thermionic cathode of claim 1, wherein the emitter has a cylindrical main body and the cylindrical main body has an upper section including an electron emitting surface.

12. The thermionic cathode of claim 11, wherein the electron emitting surface is flat.

13. The thermionic cathode of claim 11, wherein the upper section has a truncated conical shape.

14. The thermionic cathode of claim 12, wherein the electron emitting surface has an area in a range from 30 μm to 250 μm.

15. An electron emission apparatus, comprising:
   a thermionic cathode, including
      an emitter consisting of perovskite material in crystal or sintered form;
      a heat source operably connected to the thermionic cathode and configured to provide heat to the emitter; and
   a support for the emitter,
   wherein the perovskite material has a formula ABO3, where A is strontium and B is selected from vanadium (V), Niobium (Nb), and combinations thereof.

16. The electron emission apparatus of claim 15, further comprising:
   an anode disposed above the emitter.

17. A thermionic cathode, comprising:
   an emitter comprising a coating consisting of a sintered perovskite material,
   wherein an operating temperature of the thermionic cathode is in a range from 900° C. to 1500° C. and the sintered perovskite material has a formula ABO3, where A is strontium and B is selected from vanadium (V), Niobium (Nb), and combinations thereof.

18. The thermionic cathode of claim 17, wherein the sintered perovskite material is strontium vanadate and the operating temperature is in a range from 150 K to 1310K.

* * * * *